(12) United States Patent
Cheng

(10) Patent No.: US 12,382,661 B2
(45) Date of Patent: Aug. 5, 2025

(54) THIN-FILM TRANSISTOR, DISPLAY PANEL, AND ELECTRONIC DEVICE

(71) Applicant: TCL CHINA STAR OPTOELECTRONICS TECHNOLOGY CO., LTD., Guangdong (CN)

(72) Inventor: Xi Cheng, Guangdong (CN)

(73) Assignee: TCL CHINA STAR OPTOELECTRONICS TECHNOLOGY CO., LTD., Guangdong (CN)

(*) Notice: Subject to any disclaimer, the term of this patent is extended or adjusted under 35 U.S.C. 154(b) by 0 days.

(21) Appl. No.: 17/593,890

(22) PCT Filed: Jul. 9, 2021

(86) PCT No.: PCT/CN2021/105453
§ 371 (c)(1),
(2) Date: Sep. 27, 2021

(87) PCT Pub. No.: WO2022/267104
PCT Pub. Date: Dec. 29, 2022

(65) Prior Publication Data
US 2024/0047544 A1    Feb. 8, 2024

(30) Foreign Application Priority Data
Jun. 23, 2021    (CN) .................... 202110696721.0

(51) Int. Cl.
*H10D 30/67* (2025.01)
*H10D 86/40* (2025.01)
*H10D 86/60* (2025.01)

(52) U.S. Cl.
CPC ....... *H10D 30/673* (2025.01); *H10D 30/6729* (2025.01); *H10D 30/6757* (2025.01);
(Continued)

(58) Field of Classification Search
CPC ......... H01L 29/42384; H01L 29/41733; H01L 29/78696; H01L 29/42392; H01L 27/1214;
(Continued)

(56) References Cited

U.S. PATENT DOCUMENTS

| 7,964,901 B2* | 6/2011 | Benwadih ............ H10K 10/484 |
| | | 257/618 |
| 8,378,415 B2* | 2/2013 | Higashino ........... H01L 29/7827 |
| | | 257/329 |

(Continued)

FOREIGN PATENT DOCUMENTS

| CN | 106129087 A | 11/2016 |
| CN | 108155246 A | 6/2018 |

(Continued)

OTHER PUBLICATIONS

Kim et al., A New Architecture for Fibrous Organic Transistors Based on a Double-Stranded Assembly of Electrode Microfibers for Electronic Textile Applications, Adv. Mater. 2019, 31, 1900564 (Year: 2019).*

(Continued)

*Primary Examiner* — Earl N Taylor

(57) ABSTRACT

The present application discloses a thin-film transistor, a display panel, and an electronic device. The thin-film transistor includes a gate, a gate insulating layer, and a semiconductor layer sequentially disposed from an inside to an outside along a radial direction. The thin-film transistor further includes a source and a drain disposed on a side of the semiconductor layer and arranged at intervals, and the source and the drain are connected to the semiconductor layer.

9 Claims, 6 Drawing Sheets

(52) U.S. Cl.
CPC ............. *H10D 86/40* (2025.01); *H10D 86/60* (2025.01); *H10D 86/441* (2025.01)

(58) Field of Classification Search
CPC ................ H01L 29/786; H10D 30/673; H10D 30/6729; H10D 30/6757; H10D 86/40; H10D 86/60; H10D 86/441
See application file for complete search history.

(56) References Cited

U.S. PATENT DOCUMENTS

| | | | | |
|---|---|---|---|---|
| 9,564,479 | B2* | 2/2017 | Nguyen | ............. H10K 59/1213 |
| 9,853,163 | B2* | 12/2017 | Zhang | ............... H01L 29/42392 |
| 2006/0220015 | A1* | 10/2006 | Rho | .................... H01L 27/1222 |
| | | | | 257/E21.415 |
| 2009/0032849 | A1* | 2/2009 | Higashino | ........... H01L 29/7827 |
| | | | | 438/192 |
| 2012/0192916 | A1* | 8/2012 | Wenxu | .................... H02S 30/20 |
| | | | | 257/E31.124 |
| 2013/0140628 | A1* | 6/2013 | Higashino | ......... H01L 29/66666 |
| | | | | 257/329 |
| 2014/0332859 | A1* | 11/2014 | Colinge | ............. H01L 29/0676 |
| | | | | 257/288 |
| 2016/0247867 | A1* | 8/2016 | Nguyen | ............. H10K 59/1213 |
| 2018/0287081 | A1 | 10/2018 | Liu | |
| 2021/0074793 | A1* | 3/2021 | Baek | .................. H10K 59/1213 |

FOREIGN PATENT DOCUMENTS

| | | |
|---|---|---|
| CN | 108493236 A | 9/2018 |
| CN | 111599870 A | 8/2020 |
| JP | 2005159332 A | 6/2005 |
| KR | 20120121747 A | 11/2012 |

OTHER PUBLICATIONS

Schwarz A, Cardoen J, Westbroek P, et al. Steps Towards a Textile-Based Transistor: Development of the Gate and Insulating Layer. Textile Research Journal. 2010;80(16):1738-1746. doi:10.1177/0040517510365948 (Year: 2010).*

* cited by examiner

THIN-FILM TRANSISTOR, DISPLAY PANEL, AND ELECTRONIC DEVICE

FIELD OF INVENTION

The present application is related to the field of display technology and specifically to a thin-film transistor, a panel, and an electronic device.

BACKGROUND OF INVENTION

For display products, stability and uniformity of thin-film transistor (TFT) play a vital role in an enhancement of display effects. With continuous development of the display market, the display products have put forward higher requirements for TFT performances.

A structure of a conventional TFT is usually planar, such as a back channel etch (BCE) structure, an etch stop layer (ESL) structure, a coplanar structure, etc. Since a planar TFT structure occupies a large area, it is not beneficial for a realization of an integrated design of the TFT.

SUMMARY OF INVENTION

The present application provides a thin-film transistor, a panel, and an electronic device which can solve a technical problem of a conventional having a larger occupied space.

The present application provides a thin-film transistor. The thin-film transistor includes a gate, a gate insulating layer, and a semiconductor layer sequentially disposed from an inside to an outside along a radial direction. The thin-film transistor further includes a source and a drain disposed on a side of the semiconductor layer and arranged at intervals. The source and the drain are connected to the semiconductor layer.

Optionally, in an embodiment of the present application, the thin-film transistor further includes a columnar structure, the gate, the gate insulating layer, and the semiconductor layer are sequentially disposed from the inside to the outside along the radial direction of the columnar structure.

Optionally, in an embodiment of the present application, the gate is columnar, the source and the drain are arranged at intervals along an axial direction of the gate, and the semiconductor layer is disposed between the source and the drain.

Optionally, in an embodiment of the present application, on a plane perpendicular to the axial direction of the gate, an orthographic projection of the source on the plane overlaps an orthographic projection of the drain on the plane; and
along the axial direction of the gate, a channel region is provided between the source and the drain, the channel region exposes the semiconductor layer, a side of the channel region adjacent to the source includes a first boundary line, a side of the channel region adjacent to the drain includes a second boundary line, a first side of the source and a second side of the drain are adjacent to and directly face each other, the first side coincides with the first boundary line, and the second side coincides with the second boundary line.

Optionally, in an embodiment of the present application, the orthographic projection of the source and/or the drain on the plane is ring-shaped, and an orthographic projection of the semiconductor layer on the plane is ring-shaped.

Optionally, in an embodiment of the present application, the source and the drain are arranged at intervals along a circumferential direction of the gate, and the semiconductor layer is disposed between the source and the drain.

Optionally, in an embodiment of the present application, along the circumferential direction of the thin-film transistor, a first channel region and a second channel region are provided between the source and the drain, and the semiconductor layer exposed by the first channel region and the second channel region is connected to the source and the drain along the circumferential direction; and
lengths of the first channel region and the second channel region in the circumferential direction are same.

The present application further provides a display panel. The display panel includes a thin-film transistor. The thin-film transistor includes a gate, a gate insulating layer, and a semiconductor layer sequentially disposed from an inside to an outside along a radial direction. The thin-film transistor further includes a source and a drain disposed on a side of the semiconductor layer and arranged at intervals. The source and the drain are connected to the semiconductor layer.

Optionally, in an embodiment of the present application, the display panel further includes at least two thin-film transistors, the gates of the at least two thin-film transistors are connected and extend along a first direction, and the least two thin-film transistors are arranged along the first direction; and
the source and the drain of each of the least two thin-film transistors are arranged at intervals along an axial direction or a circumferential direction of the gate.

Optionally, in an embodiment of the present application, the display panel further includes at least two thin-film transistors sharing a same columnar gate, the sources of the at least two thin-film transistors are arranged at intervals along the circumferential direction of the gate, the drains of the at least two thin-film transistors are arranged at intervals along the circumferential direction of the gate, and the source and the drain of a same one of the at least two thin-film transistors are arranged at intervals along the axial direction of the gate.

Optionally, in an embodiment of the present application, the display panel further includes a first thin-film transistor and a second thin-film transistor sharing the same columnar gate, the source of the first thin-film transistor and the source of the second thin-film transistor are arranged at intervals along the circumferential direction of the gate, the drain of the first thin-film transistor and the drain of the second thin-film transistor are arranged at intervals along the circumferential direction of the gate, the source and the drain of the first thin-film transistor are arranged at intervals along the axial direction of the gate, and the source and the drain of the second thin-film transistor are arranged at intervals along the axial direction of the gate.

Optionally, in an embodiment of the present application, the gates of the at least two thin-film transistors are connected and extend along a first direction, and the least two thin-film transistors are arranged along the first direction Optionally, in an embodiment of the present application, the display panel further includes a plurality of scan lines extending in a first direction and a plurality of data lines extending in a second direction, the second direction is perpendicular to the first direction, the scan lines and the data lines define a plurality of pixel units, and each of the pixel units includes the thin-film transistor and a pixel electrode; and
each of the scan lines includes a columnar portion extending along the first direction, at least a portion of the columnar portion forms the gate of the thin-film transistor, and the gate insulating layer and the semiconductor layer of the thin-film transistor are sequentially arranged on the columnar portion from the inside to the outside along the radial direction of the columnar portion.

The present application further provides an electronic device including a thin-film transistor. The thin-film transistor includes a gate, a gate insulating layer, and a semiconductor layer sequentially disposed from an inside to an outside along a radial direction. The thin-film transistor further includes a source and a drain disposed on a side of the semiconductor layer and arranged at intervals, and the source and the drain are connected to the semiconductor layer.

Optionally, in an embodiment of the present application, the thin-film transistor further includes a columnar structure, and the gate, the gate insulating layer, and the semiconductor layer are sequentially disposed from the inside to the outside along the radial direction of the columnar structure.

Optionally, in an embodiment of the present application, the gate is columnar, the source and the drain are arranged at intervals along an axial direction of the gate, and the semiconductor layer is disposed between the source and the drain.

Optionally, in an embodiment of the present application, on a plane perpendicular to the axial direction of the gate, an orthographic projection of the source on the plane overlaps an orthographic projection of the drain on the plane; and along the axial direction of the gate, a channel region is provided between the source and the drain, the channel region exposes the semiconductor layer, a side of the channel region adjacent to the source includes a first boundary line, a side of the channel region adjacent to the drain includes a second boundary line, a first side of the source and a second side of the drain are adjacent to and directly face each other, the first side coincides with the first boundary line, and the second side coincides with the second boundary line.

Optionally, in an embodiment of the present application, wherein the orthographic projection of the source and/or the drain on the plane is ring-shaped, and an orthographic projection of the semiconductor layer on the plane is ring-shaped.

Optionally, in an embodiment of the present application, the source and the drain are arranged at intervals along a circumferential direction of the gate, and the semiconductor layer is disposed between the source and the drain.

Optionally, in an embodiment of the present application, along the circumferential direction of the thin-film transistor, a first channel region and a second channel region are provided between the source and the drain, and the semiconductor layer exposed by the first channel region and the second channel region is connected to the source and the drain along the circumferential direction; and lengths of the first channel region and the second channel region in the circumferential direction are same.

In an embodiment of the present application, the thin-film transistor provided by the present application includes the gate, the gate insulating layer, and the semiconductor layer that are sequentially disposed from the inside to the outside along the radial direction. The thin-film transistor further includes the source and the drain. The source and the drain are disposed on a side of the semiconductor layer and arranged at intervals. Both the source and the drain are connected to the semiconductor layer. Since the thin-film transistor of the present application includes a three-dimensional structure and the source and the drain are both surrounding structures, compared with a planar thin-film transistor structure, on a premise of meeting driving requirements of the thin-film transistor, the thin-film transistor provided by the present application has a smaller occupied area, which can save an occupied space of the thin-film transistor, and facilitate realizing an integrated design of the thin-film transistor.

DESCRIPTION OF DRAWINGS

In order to describe technical solutions in the present application clearly, drawings to be used in the description of embodiments will be described briefly below. Obviously, drawings described below are only for some embodiments of the present application, and other drawings can be obtained by those skilled in the art based on these drawings without creative efforts.

DETAILED DESCRIPTION OF EMBODIMENTS

The technical solution of the present application embodiment will be clarified and completely described with reference accompanying drawings in embodiments of the present application embodiment. Obviously, the present application described parts of embodiments instead of all of the embodiments. Based on the embodiments of the present application, other embodiments which can be obtained by a skilled in the art without creative efforts fall into the protected scope of the of the present application.

Embodiments of the present application provide a thin-film transistor, a display panel, and an electronic device. Detailed descriptions are given below. It should be noted that an order of descriptions in the following embodiments is not meant to limit a preferred order of the embodiments.

It should be noted that in the following embodiments of the present application, a "columnar structure" can be a cylinder. An "axial direction" refers to a direction of the columnar structure rotating a central axis, which is a direction identical to the central axis. A "radial direction" refers to a linear direction along a diameter of an end circle of the columnar structure. In addition, the present application only illustrates a situation when the "radial direction" and the "axial direction" are perpendicular to each other, but it cannot be understood as a limitation of the present application. A "circumferential direction" refers to a direction surrounding the central axis of the columnar structure.

The present application provides a thin-film transistor. The thin-film transistor includes a gate, a gate insulating layer, and a semiconductor layer that are sequentially disposed from an inside to an outside along the radial direction. The thin-film transistor further includes a source and a drain. The source and the drain are disposed on a side of the semiconductor layer and arranged at intervals. Both the source and the drain are connected to the semiconductor layer.

Since the thin-film transistor of the present application includes a three-dimensional structure and the source and the drain are both surrounding structures, compared with a planar thin-film transistor structure, on a premise of meeting driving requirements of the thin-film transistor, the thin-film transistor provided by the present application has a smaller occupied area, which can save an occupied space of the thin-film transistor, and facilitate realizing an integrated design of the thin-film transistor.

The thin-film transistor provided in the present application will be described in detail below through specific embodiments.

Figure 1:
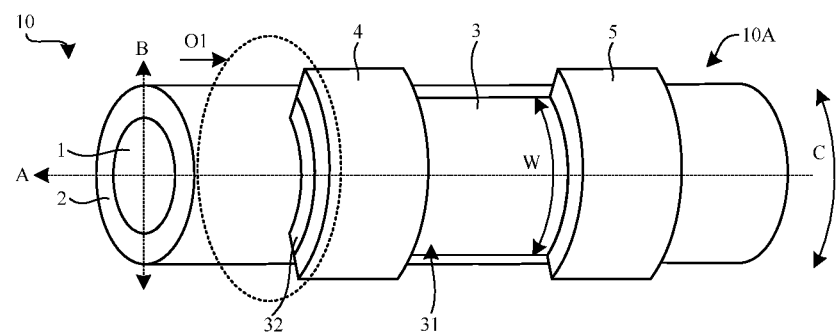
FIG. 1 is a perspective schematic diagram of a thin-film transistor provided by a first embodiment of the present application.
Figure 2:
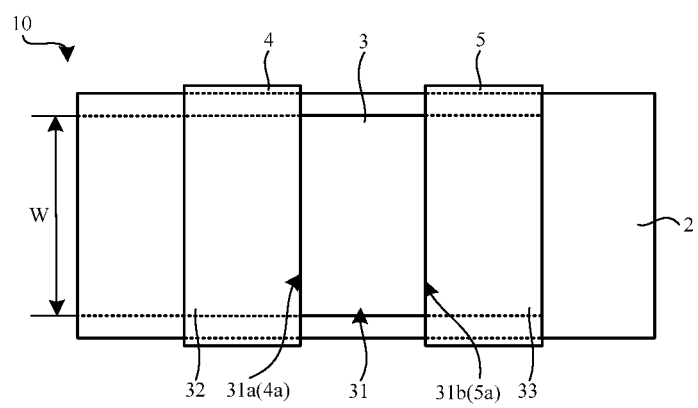
FIG. 2 is a front view of the thin-film transistor as shown in FIG. 1.
Figure 3:
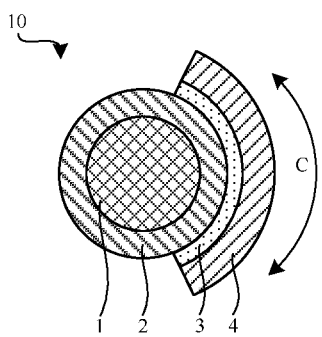
FIG. 3 is a cross-sectional diagram of the thin-film transistor as shown in FIG. 1 along a first plane O1.

Referring to FIGS. 1-3, a first embodiment of the present application provides a thin-film transistor 10. The thin-film transistor 10 includes a gate 1, a gate insulating layer 2, and a semiconductor layer 3 that are sequentially disposed from the inside to the outside along a radial direction B. The thin-film transistor 10 further includes a source 4 and a drain 5. The source 4 and the drain 5 are disposed on a side of the semiconductor layer 3 and arranged at intervals. Both the source 4 and the drain 5 are connected to the semiconductor layer 3.

As shown in FIG. 1, the thin-film transistor 10 includes a columnar structure 10A. The gate 1, the gate insulating layer 2, and the semiconductor layer 3 are sequentially disposed from the inside to the outside along the radial direction B of the columnar structure 10A. The gate 1, the gate insulating layer 2, and the semiconductor layer 3 are substantially disposed coaxially.

The gate 1 is columnar. A material of the gate 1 can be one or a combination of conductive materials such as silicon, copper, silver, gold, etc. In this embodiment, the material of the gate 1 is silicon. When silicon is used as the material of the gate 1, the gate 1 has good elasticity, and a bending resistance of the gate 1 can be enhanced, and a bending resistance of the thin-film transistor 10 can be enhanced.

The gate insulating layer 2 is a hollow columnar structure. The gate insulating layer 2 is sleeved on an outer surface of the gate 1. A material of the gate insulating layer 2 can be one or a combination of silicon nitride, silicon oxide, or silicon oxynitride. It should be noted that the material of the gate insulating layer 2 can be selected according to actual application requirements, which is not specifically limited in the present application.

The semiconductor layer 3 is provided on an outer surface of the gate insulating layer 2. A material of the semiconductor layer 3 can include amorphous silicon, low-temperature polysilicon, or metal oxide. The metal oxide can include IGZO, IGZTO, IZTO, IGTO, etc.

The source 4 and the drain 5 are disposed on an outer surface of the semiconductor layer 3. The source 4 and the drain 5 can be a single-layer structure, a double-layer structure, or a triple-layer structure. The source 4 and the drain 5 can be made of a same material including metals such as copper, aluminum, molybdenum, titanium, silver, or alloys formed of the foregoing metals.

In an embodiment, the source 4 and the drain 5 can also be disposed on an inner surface of the semiconductor layer 3. That is, the source 4 and the drain 5 can also be disposed between the semiconductor layer 3 and the gate insulating layer 2, and will not be repeated herein.

Referring to FIGS. 1 and 2, the source 4 and the drain 5 are arranged at intervals along an axial direction A of the gate 1. Along the axial direction A of the gate 1, a channel region 31 is provided between the source 4 and the drain 5. The channel region 31 exposes the semiconductor layer 3. The source 4 and the drain 5 contact the semiconductor layer 3 on both sides of the channel region 31, respectively. A portion where the semiconductor layer 3 contacts the source 4 is a first contact portion 32. A portion where the semiconductor layer 3 contacts the drain 5 is a second contact portion 33. An orthographic projection of the source 4 on the outer surface of the gate insulating layer 2 covers an orthographic projection of the first contact portion 32 on the outer surface of the gate insulating layer 2. An orthographic projection of the drain 5 on the outer surface of the gate insulating layer 2 covers the orthographic projection of the second contact portion 33 on the outer surface of the gate insulating layer 2.

Referring to FIGS. 1 and 3, a plane perpendicular to the axial direction A of the gate 1 is a first plane O1, and the orthographic projection of the source 4 on the first plane O1 overlaps with the orthographic projection of the drain 5 on the first plane O1.

As shown in FIG. 2, on the axial direction A of the gate 1, a side of the channel region 31 adjacent to the source 4 includes a first boundary line 31a, and a side of the channel region 31 adjacent to the drain 5 includes a second boundary line 31b. A first side 4a of the source 4 and a second side 5a of the drain 5 are adjacent to and directly face each other. The first side 4a coincides with the first boundary line 31a. The second side 5a coincides with the second boundary line 31b. Lengths of the first side 4a and the second side 5a are the same. The length of the first side 4a is a width W of the channel region 31. When sizes of the source 4 and the drain 5 are unchanged, and an interval between the source 4 and the drain 5 is unchanged, the above arrangement can maximize a channel width, thereby facilitating an increase of an output current of the thin-film transistor 10, so as to enhance a driving ability of the thin-film transistor 10.

In addition, for the thin-film transistor 10 provided in this embodiment, by controlling the length of the first side 4a, the control of the channel width can be achieved, so as to achieve a controllability of the driving ability of the thin-film transistor 10 to meet different application requirements of output current of the thin-film transistor 10.

In an embodiment, the length of the first side 4a can also be greater than a length of the first boundary line 31a. At this time, a length of an overlapping portion of the first side 4a and the first boundary line 31a is the width W of the channel region 31. The controllability of the channel width is achieved by controlling the length of the overlapping portion of the first side 4a and the first boundary line 31a.

On the premise of meeting driving requirements of the thin-film transistor 10, since the source 4 and the drain 5 in this embodiment are disposed surrounding the gate insulating layer 2, compared with the planar thin-film transistor structure, this embodiment can reduce an occupied area of the thin-film transistor 10, which can further save an occupied space of the thin-film transistor 10, and facilitate realizing an integrated design of the thin-film transistor 10.

Figure 4:
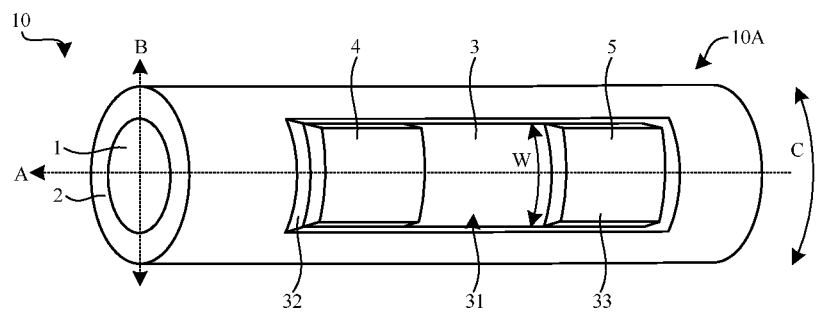
FIG. 4 is a perspective schematic diagram of a thin-film transistor provided by a second embodiment of the present application.
Figure 5:
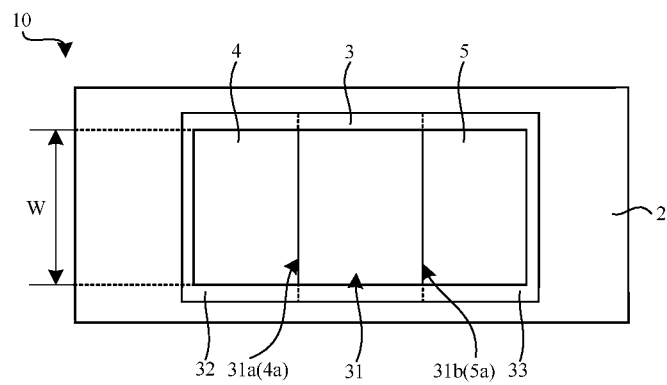
FIG. 5 is a front view of the thin-film transistor as shown in FIG. 4.

Referring to FIGS. 4 and 5, a second embodiment of the present application provides a thin-film transistor 10. Differences between the thin-film transistor 10 provided in the second embodiment and the first embodiment is that the orthographic projection of the source 4 on the outer surface of the gate insulating layer 2 is positioned within the orthographic projection of the first contact portion 32 on the outer surface of the gate insulating layer 2. The orthographic projection of the drain 5 on the outer surface of the gate insulating layer 2 is positioned within the orthographic projection of the second contact portion 33 on the outer surface of the gate insulating layer 2.

On the premise of meeting the driving requirements of the thin-film transistor 10, this embodiment can reduce occupied spaces of the source 4 and the drain 5, thereby reducing an overall occupied space of the thin-film transistor 10, which facilitates realizing the integrated design of the thin-film transistor 10.

Figure 6:
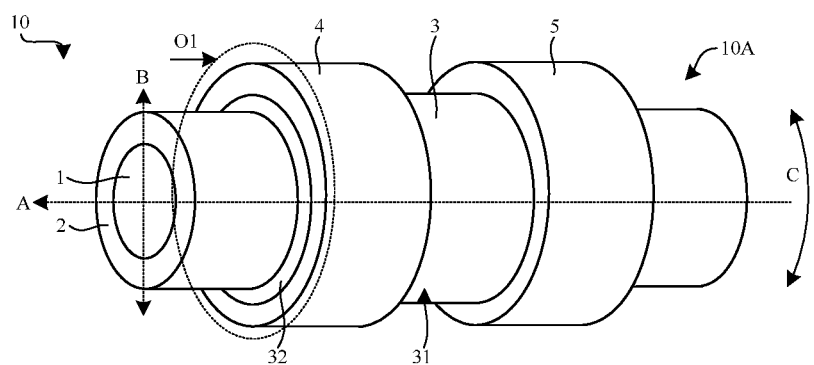
FIG. 6 is a perspective schematic diagram of a thin-film transistor provided by a third embodiment of the present application.
Figure 7:
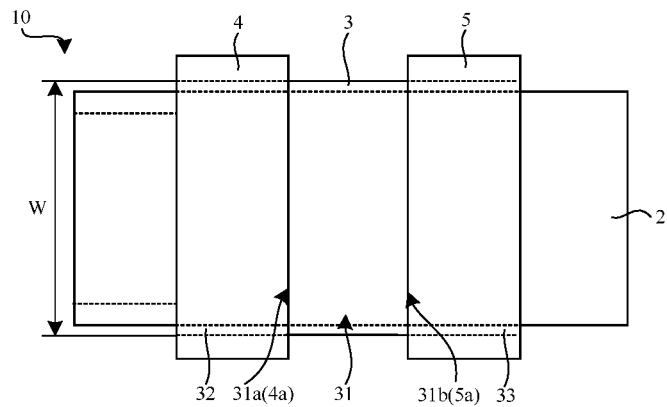
FIG. 7 is a front view of the thin-film transistor as shown in FIG. 6.
Figure 8:
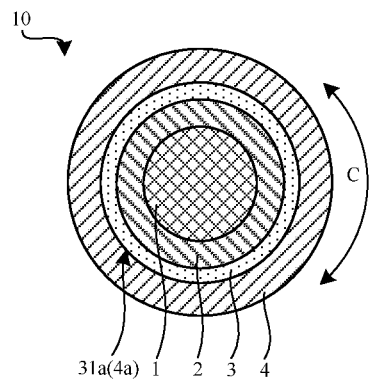
FIG. 8 is a cross-sectional diagram of the thin-film transistor as shown in FIG. 6 along a first plane O1.

Referring to FIGS. 6-8, a third embodiment of the present application provides a thin-film transistor 10. Differences between the thin-film transistor 10 provided by the third embodiment and the first embodiment is that the orthographic projections of the source 4, the drain 5, and the semiconductor layer 3 on the first plane O1 are all ring-shaped. That is, the source 4, the drain and the semiconductor layer 3 are all hollow columnar structures.

In this embodiment, in the direction perpendicular to the axial direction A of the gate 1, a cross-sectional structure of the source 4 is a ring. The length of the first side 4a of the source 4 is an inner circumference of the ring. Referring to FIGS. 7 and 8, the length of the first side 4a of the source 4 is equal to the length of the first boundary line 31a of the channel region 31, which is a channel width W. As shown in FIG. 8, a circumference of a circle at a surface of the source 4 adjacent to the semiconductor layer 3 is the length of the first side 4a. Therefore, the channel width W of the thin-film transistor 10 of this embodiment is the inner circumference of the ring. Similarly, the length of the second side 5a of the drain 5 is also the inner circumference of a ring corresponding to the drain 5. It should be noted that, in this embodiment, a cross-sectional structure of the drain 5 is the same as the cross-sectional structure of the source 4, and the lengths of the second side 5a and the first side 4a are the same. Therefore, this embodiment only takes the cross-sectional structure of the source 4 as an example for description, but it should not be understood as a limitation of the present application.

On the premise that a length of the thin-film transistor 10 along the axial direction A remains unchanged, this embodiment can maximize the channel width, thereby maximizing the output current of the thin-film transistor thereby improving the driving ability of the thin-film transistor 10. In addition, in this embodiment, through arranging the source 4 and the drain 5 as the hollow columnar structures, difficulty of process operation during formation of the source 4 and the drain 5 can be reduced, thereby simplifying the process and saving process costs.

It should be noted that, in an embodiment, one of the source 4 and the drain 5 can also be arranged as the hollow columnar structure, which will not be repeated herein.

Figure 9:
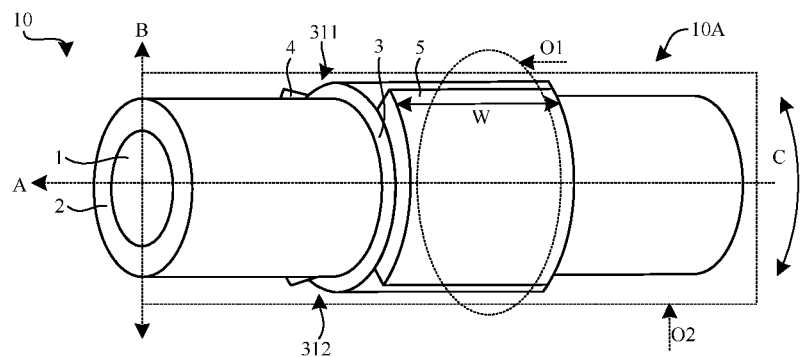
FIG. 9 is a perspective schematic diagram of a thin-film transistor provided by a fourth embodiment of the present application.
Figure 10:
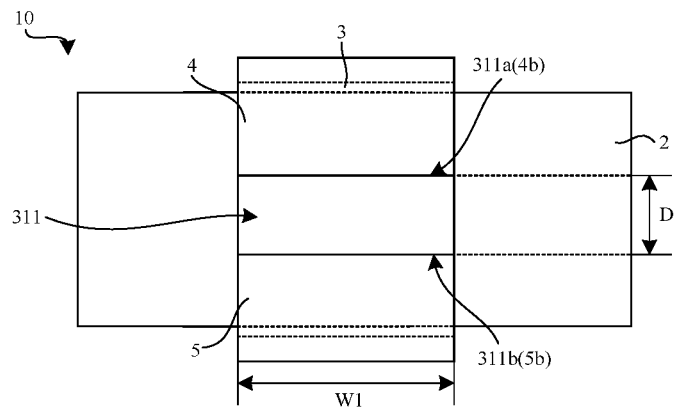
FIG. 10 is a top view of the thin-film transistor as shown in FIG. 9.
Figure 11:
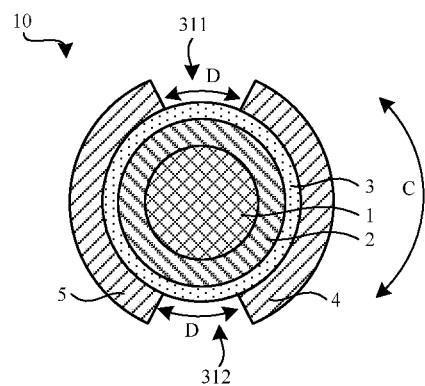
FIG. 11 is a cross-sectional diagram of the thin-film transistor as shown in FIG. 9 along a first plane O1.

Referring to FIGS. 9-11, a fourth embodiment of the present application provides a thin-film transistor 10. In the fourth embodiment, the thin-film transistor 10 includes the gate 1, the gate insulating layer 2, and the semiconductor layer 3 that are sequentially disposed from the inside to the outside in the radial direction B. The thin-film transistor 10 further includes the source 4 and the drain 5. The source 4 and the drain 5 are disposed on a side of the semiconductor layer 3 and arranged at intervals. Both the source 4 and the drain 5 are connected to the semiconductor layer 3.

As shown in FIG. 9, the thin-film transistor 10 includes the columnar structure 10A. The gate 1, the gate insulating layer 2, and the semiconductor layer 3 are sequentially disposed from the inside to the outside along the radial direction B of the columnar structure 10A. The gate 1, the gate insulating layer 2, and the semiconductor layer 3 are substantially disposed coaxially.

The gate 1 is columnar. The material of the gate 1 can be one or a combination of conductive materials such as silicon, copper, silver, gold, etc. In this embodiment, the material of the gate 1 is silicon. When silicon is used as the material of the gate 1, the gate 1 has good elasticity, and the bending resistance of the gate 1 can be enhanced, and the bending resistance of the thin-film transistor 10 can be enhanced.

The gate insulating layer 2 is the hollow columnar structure. The gate insulating layer 2 is sleeved on the outer surface of the gate 1. The material of the gate insulating layer 2 can be one or a combination of silicon nitride, silicon oxide, or silicon oxynitride. It should be noted that the material of the gate insulating layer 2 can be selected according to actual application requirements, which is not specifically limited in the present application.

The semiconductor layer 3 is provided on the outer surface of the gate insulating layer 2. The material of the semiconductor layer 3 can include amorphous silicon, low-temperature polysilicon, or metal oxide. The metal oxide can include IGZO, IGZTO, IZTO, IGTO, etc.

The source 4 and the drain 5 are disposed on the outer surface of the semiconductor layer 3. The source 4 and the drain 5 can be the single-layer structure, the double-layer structure, or the triple-layer structure. The source 4 and the drain 5 can be made of the same material including metals such as copper, aluminum, molybdenum, titanium, silver, or alloys formed of the foregoing metals.

In an embodiment, the source 4 and the drain 5 can also be disposed on the inner surface of the semiconductor layer 3. That is, the source 4 and the drain 5 can also be disposed between the semiconductor layer 3 and the gate insulating layer 2, and will not be repeated herein.

The source 4 and the drain 5 are arranged at intervals along a circumferential direction C of the gate 1. Along the circumferential direction C of the gate 1, a first channel region 311 and a second channel region 312 are provided between the source 4 and the drain 5. The semiconductor layer 3 exposed by the first channel region 311 and the second channel region 312 is connected to the source 4 and the drain 5 along the circumferential direction C. That is, taking the first channel region 311 as an example, a boundary of the first channel region 311 coincides with boundaries of the source 4 and the drain 5 on both sides of the first channel region 311.

In this embodiment, the semiconductor layer 3 includes the hollow columnar structure. As shown in FIG. 11, lengths of the first channel region 311 and the second channel region 312 along the circumferential direction C are substantially the same, and both are D. The above-mentioned arrangement can improve electrical performance and stability of the thin-film transistor 10.

Referring to FIGS. 9 and 11, a plane where the axial direction A of the gate 1 is positioned is a second plane O2, and an orthographic projection of the source 4 on the second plane O2 overlaps with an orthographic projection of the drain 5 on the second plane O2.

On the circumferential direction C along the gate 1, the first channel region 311 includes a third boundary line 311a on the side adjacent to the source 4, and the first channel region 311 includes a fourth boundary line 311b on the side adjacent to the drain 5. A third side 4b of the source 4 and a fourth side 5b of the drain 5 are adjacent to and directly face each other. The third side 4b coincides with the third boundary line 311a. The fourth side 5b coincides with the fourth boundary line 311b. Lengths of the third side 4b and the fourth side 5b are the same. The length of the third side 4b is a width W1 of the first channel region 311. When the sizes of the source 4 and the drain 5 is unchanged and the interval between the source 4 and the drain 5 is unchanged, the above arrangement can maximize the channel width, thereby facilitating the increase of the output current of the thin-film transistor 10, so as to enhance the driving ability of the thin-film transistor 10.

In addition, for the thin-film transistor 10 provided in this embodiment, by controlling the length of the third side 4b, the control of the channel width can be achieved, so as to achieve the controllability of the driving ability of the thin-film transistor 10 to meet the different application requirements of the output current of the thin-film transistor 10.

In an embodiment, the length of the third side 4b can also be greater than a length of the third boundary line 311a. At this time, a length of an overlapping portion of the third side 4b and the third boundary line 311a is the width W1 of the first channel region 311. The controllability of the channel width is achieved by controlling the length of the overlapping portion of the third side 4b and the third boundary line 311a.

On the premise of meeting the driving requirements of the thin-film transistor 10, since the source 4 and the drain 5 in this embodiment are disposed surrounding the gate insulating layer 2, compared with the planar thin-film transistor structure, this embodiment can reduce the occupied area of the thin-film transistor 10, which can further save the occupied space of the thin-film transistor 10, and facilitate realizing the integrated design of the thin-film transistor 10.

Figure 12:
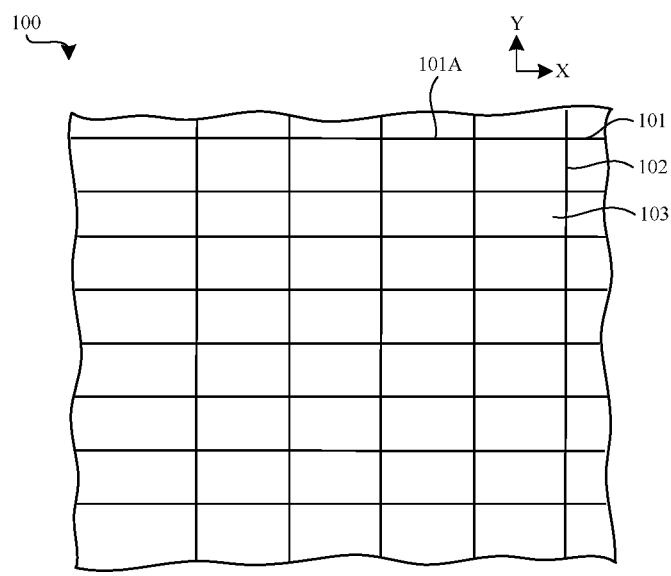
FIG. 12 is a structural schematic diagram of a display panel provided by the present application.

Referring to FIG. 12, the present application further provides a display panel 100. The display panel 100 includes a plurality of scan lines 101 extending in a first direction X and a plurality of data lines 102 extending in a second direction Y. The second direction Y is perpendicular to the first direction X. The scan lines 101 and the data lines 102 define a plurality of pixel units 103. Each of the pixel units 103 includes a thin-film transistor (not shown) and a pixel electrode (not shown).

Figure 13:
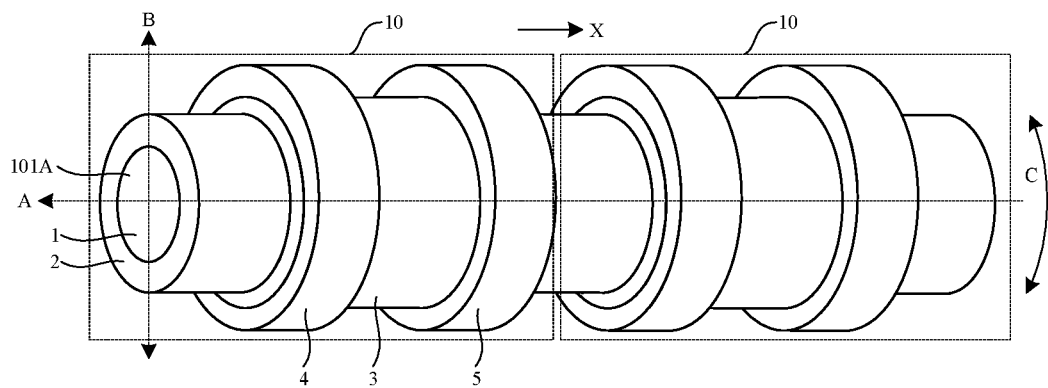
FIG. 13 is a structural schematic diagram of a first embodiment of the display panel arranging two adjacent thin-film transistors along a first direction provided by the present application.

Referring to FIGS. 12 and 13, in a first embodiment of the display panel 100 provided by the present application, a thin-film transistor 10 includes a gate 1, a gate insulating layer 2 and a semiconductor layer 3 that are sequentially disposed from an inside to an outside in a radial direction B. The thin-film transistor 10 further includes a source 4 and a drain 5. The source 4 and the drain 5 are disposed on a side of the semiconductor layer 3 and arranged at intervals. Both the source 4 and the drain 5 are connected to the semiconductor layer 3. In the first direction X, the gates 1 of at least two thin-film transistors 10 are connected and extend along the first direction X. At least two thin-film transistors 10 are arranged along the first direction X.

In this embodiment, in the at least two thin-film transistors 10 connected to the gate 1, the gate 1 of a corresponding one of the thin-film transistors 10 are integrally formed, and the source 4 and the drain 5 of each of the thin-film transistors 10 are arranged at intervals along the axial direction A of the gate 1. In this embodiment, the source 4, the drain 5, and the semiconductor layer 3 of each of the thin-film transistors 10 can be correspondingly formed on the gate 1 formed integrally, so that an integration degree of the thin-film transistors 10 can be enhanced.

It should be noted that the thin-film transistors 10 connected to the gate 1 can be two, three, or more of the thin-film transistors 10 arranged at intervals along the first direction X. In this embodiment, only a structure of two adjacent thin-film transistors 10 arranged at intervals along the first direction X is taken as an example for description, but not limited thereto.

Specifically, each of the scan lines 101 includes a columnar portion 101A extending along the first direction X. At least a part of the columnar portions 101A form the gate 1 of the thin-film transistor 10. The gate insulating layer 2 and the semiconductor layer 3 of the thin-film transistor 10 are sequentially arranged on the columnar portion 101A from an inside to an outside along a radial direction B.

It should be noted that, for the pixel units 103 arranged along the first direction X, the gate 1 of each of the thin-film transistors 10 in the pixel units 103 can be formed by the same columnar portion 101A. That is, one, two, or more gates 1 of the thin-film transistor 10 can be formed on the columnar portion 101A to enhance the integration degree of the thin-film transistors 10. In this embodiment, only a structure corresponding to forming the gates 1 on one of the columnar portions 101A of two adjacent thin-film transistors 10 is taken as an example for description, but not limited thereto.

A manufacturing process of the display panel 100 of this embodiment is as follows:

(1) providing a substrate.

(2) providing a columnar wire as a columnar portion of a scan line. The columnar portion can be directly connected to an external scanning signal and used as a gate of a thin-film transistor. The columnar wire can be a silicon wire or a metal wire such as copper, aluminum, etc. In this embodiment, the columnar portion is a silicon wire to enhance a bending resistance of the gate, so as to facilitate enhancing of a bending resistance of the thin-film transistor formed subsequently, thereby enhancing a bending resistance of the display panel.

(3) forming a gate insulating layer on an outer surface of the columnar portion, and patterning the gate insulating layer to form a plurality of patterned gate insulating layers arranged at intervals.

(4) forming a semiconductor layer on an outer surface of the gate insulating layer, patterning the semiconductor layer, and patterned semiconductor layers correspond to the patterned gate insulating layers one by one.

(5) forming a source and a drain are correspondingly on each of the semiconductor layers. Each of the patterned gate insulating layers, the patterned semiconductor layers, the source, the drain, and the corresponding columnar portion (the gate) form the thin-film transistor. The patterned gate insulating layers, the semiconductor layers, the source, and the drain can be formed through adopting inkjet printing, evaporation, a solution method, a chemical vapor deposition method, squeegee coating, or pulling process.

(6) sequentially forming a pixel electrode, a light-emitting layer, and other structures corresponding to each of the thin-film transistors.

In the display panel 100 provided in this embodiment, the integration degree of the thin-film transistor 10 in the display panel 100 can be enhanced through disposing the semiconductor layer 3, the source 4, and the drain 5 of the thin-film transistors 10 on the columnar portions 101A of the scan lines 101, and the columnar portion 101A being configured as the gate 1 of the thin-film transistor 10. In addition, since the columnar portion 101A is formed by silicon wires, the present embodiment can enhance the bending resistance of the thin-film transistor 10, which facilitates enhancing the bending resistance of the display panel 100.

Figure 14:
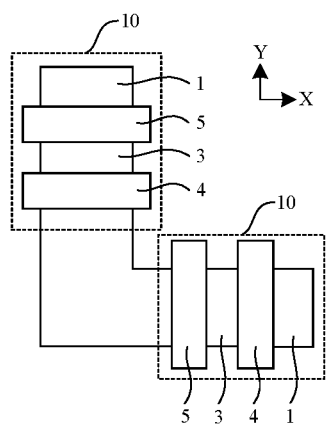
FIG. 14 is a structural schematic diagram of a second embodiment of the display panel arranging two adjacent thin-film transistors along a first direction and a second direction provided by the present application.

Referring to FIG. 14, in the second embodiment of the display panel 100 provided in the present application, differences from the display panel 100 of the first embodiment is that the at least one thin-film transistor 10 in the first direction X and the is connected to the gate 1 of the at least one thin-film transistor 10 in the second direction Y. The source 4 and the drain 5 of the thin-film transistor 10 are arranged at intervals along the first direction X. The semiconductor layer 3 is disposed between the source 4 and the drain 5. The source 4 and the drain 5 of the thin-film transistor 10 in the second direction Y are arranged at intervals along the second direction Y. The semiconductor layer 3 is disposed between the source 4 and the drain 5.

It should be noted that, this embodiment only illustrates a structure in which one of the thin-film transistors 10 in the first direction X is connected to the gate 1 of one of the thin-film transistors 10 in the second direction Y, but not limited thereto. In an embodiment, the thin-film transistors can be arranged along the first direction X, and the thin-film transistors 10 can also be arranged along the second direction Y, which will not be repeated herein.

Figure 15:
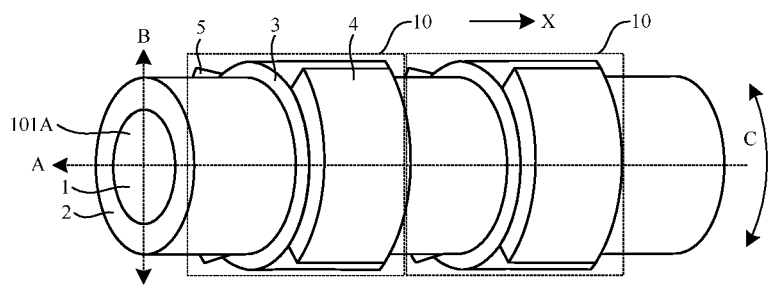
FIG. 15 is a structural schematic diagram of a third embodiment of the display panel arranging two adjacent thin-film transistors along a first direction provided by the present application.

Referring to FIG. 15, in the third embodiment of the display panel 100 provided by the present application, the difference from the display panel 100 of the first embodiment is that the source 4 and the drain 5 of each thin-film transistor 10 are along the gate. The circumferential direction C of pole 1 is arranged at intervals. A semiconductor layer 3 is disposed between the source 4 and the drain 5.

Figure 16:
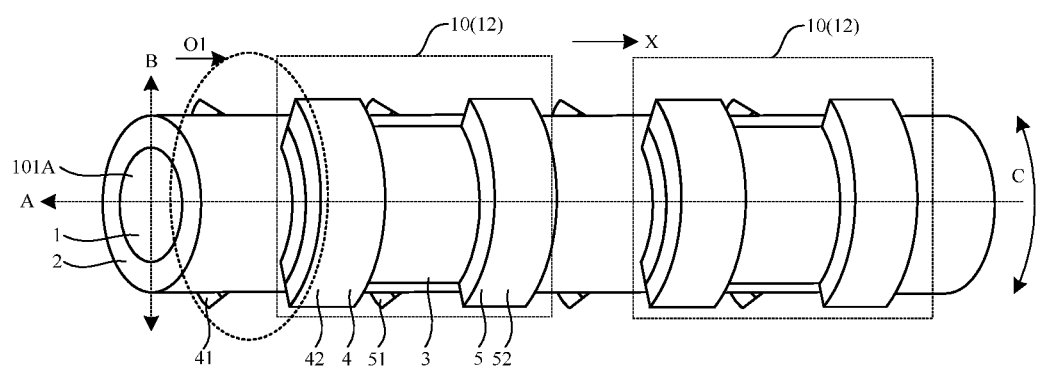
FIG. 16 is a structural schematic diagram of a fourth embodiment of the display panel arranging two adjacent thin-film transistors along a circumferential direction of a gate provided by the present application.
Figure 17:
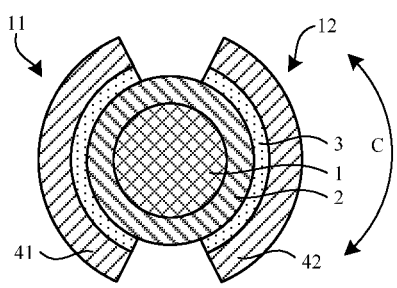
FIG. 17 is a cross-sectional diagram of the display panel as shown in FIG. 16 along a first plane O1.

Referring to FIGS. 16 and 17, in a fourth embodiment of the display panel 100 provided by the present application, the thin-film transistor 10 includes the gate 1, the gate insulating layer 2, and the semiconductor layer 3 sequentially disposed from the inside to the outside along the radial direction B. The thin-film transistor 10 further includes the source 4 and the drain 5. The source 4 and the drain 5 are disposed on a side of the semiconductor layer 3 and arranged at intervals. Both the source 4 and the drain 5 are connected to the semiconductor layer 3. The at least two thin-film transistors 10 share the same columnar gate 1. The source 4 and the drain 5 of the at least two thin-film transistors 10 are arranged at intervals along the circumferential direction C of the gate 1. In the same thin-film transistor 10, the source 4 and the drain 5 are arranged at intervals along the axial direction A of the gate 1. The semiconductor layer 3 is disposed between the source 4 and the drain 5 of each of the thin-film transistors 10.

Therefore, on the circumferential direction C of the gate 1, the present embodiment, through arranging the at least two sources 4 and the at least two drains 5 corresponding to the sources 4 one by one, when a length of the columnar gate 1 is certain, the at least two thin-film transistors 10 can be correspondingly formed on the circumferential direction C of the gate 1, thereby greatly enhancing the integration degree of the thin-film transistors 10.

It should be noted that a number of the thin-film transistors 10 sharing the same columnar gate 1 in the present application can be two, three, four, or more. This embodiment only takes the number of the thin-film transistors 10 sharing the same columnar gate 1 being two as an example for description, it is not limited thereto.

Referring to FIGS. 12, 16, and 17, the two thin-film transistors 10 sharing the same columnar gate 1 are a first thin-film transistor 11 and a second thin-film transistor 12, respectively. A source 41 of the first thin-film transistor 11 and a source 42 of the second thin-film transistor 12 are arranged at intervals along the circumferential direction C of the gate 1. A drain 51 of the first thin-film transistor 11 and a drain 52 of the second thin-film transistor 12 are arranged at intervals along the circumferential direction C of the gate 1. The source 41 and the drain 51 of the first thin-film transistor 11 are arranged at intervals along the axial direction A of the gate 1. The source 42 and the drain 52 of the second thin-film transistor 12 are arranged at intervals along the axial direction A of the gate 1.

It should be noted that in this embodiment, a cross-sectional structure of the drain 51 of the first thin-film transistor 11 is the same as a cross-sectional structure of the source 41. A cross-sectional structure of the drain 52 of the second thin-film transistor 12 is also the same as a cross-sectional structure of the source 42. This embodiment only illustrates the cross-sectional structures of the source 41 of the first thin-film transistor 11 and the source 42 of the second thin-film transistor 12 corresponding to the shared columnar gate 1, but it cannot be understood as a limitation of the present application.

Referring to FIG. 16, in this embodiment, the gates 1 of the at least two thin-film transistors 10 are connected and extend along the first direction X. The at least two thin-film transistors 10 are arranged along the first direction X. In the at least two thin-film transistors 10 connected to the gate 1, the gate 1 of a corresponding one of the thin-film transistors 10 is integrally formed. In the first direction X, an above-mentioned arrangement can correspondingly form the source 4, the drain 5, and the semiconductor layer 3 of the thin-film transistors 10 on the integrally formed gate 1, so that the integration degree of the thin-film transistor 10 can be further enhanced.

It should be noted that the thin-film transistors 10 connected to the gate 1 can be two, three, or more adjacent ones of the thin-film transistors 10 arranged along the first direction X. In this embodiment, only a structure of two of the thin-film transistors 10 arranged along the first direction X is taken as an example for description, but not limited thereto.

Referring to FIGS. 12 and 16, each of the scan lines 101 includes the columnar portion 101A extending along the first direction X. At least a part of the columnar portions 101A form the gate 1 of the thin-film transistor 10. The gate insulating layer 2 and the semiconductor layer 3 of the thin-film transistor 10 are sequentially arranged on the columnar portion 101A from the inside to the outside along a radial direction B.

It should be noted that, for the pixel units 103 arranged along the first direction X, the gate 1 of each of the thin-film transistors 10 in the pixel units 103 can be formed by the same columnar portion 101A. That is, one, two, or more gates 1 of the thin-film transistor 10 can be formed on the columnar portion 101A to enhance the integration degree of the thin-film transistors 10. In this embodiment, only the structure corresponding to forming the gates 1 on one of the columnar portions 101A of two adjacent thin-film transistors 10 is taken as an example for description, but not limited thereto.

The present application further provides an electronic device. The electronic device can be a wearable display product, such as a smart watch or a 3D head-mounted display. The electronic device includes a thin-film transistor. The thin-film transistor can be the thin-film transistor described in any one of the foregoing embodiments, which will not be repeated herein.

The thin-film transistor, the display panel, and the electronic device provided by the present application is described in detail above, the specific examples of this document are used to explain principles and embodiments of the present application, and the description of embodiments above is only for helping to understand the method of the present application and its core idea. Meanwhile, those skilled in the art will be able to change the specific embodiments and the scope of the present application according to the idea of the present application. In the above, the content of the specification should not be construed as limiting the present application. Above all, the content of the specification should not be the limitation of the present application.

What is claimed is:

1. A thin-film transistor, comprising a gate, a gate insulating layer, and a semiconductor layer sequentially disposed from an inside to an outside along a radial direction;
    wherein the thin-film transistor further comprises a source and a drain disposed on a side of the semiconductor layer and arranged at intervals, and the source and the drain are connected to the semiconductor layer;
    wherein the source and the drain are arranged at intervals along a circumferential direction of the gate, and the semiconductor layer is disposed between the source and the drain.

2. The thin-film transistor according to claim 1, further comprising a columnar structure, wherein the gate, the gate insulating layer, and the semiconductor layer are sequentially disposed from the inside to the outside along the radial direction of the columnar structure.

3. The thin-film transistor according to claim 1, wherein along the circumferential direction of the thin-film transistor, a first channel region and a second channel region are provided between the source and the drain, and the semiconductor layer exposed by the first channel region and the second channel region is connected to the source and the drain along the circumferential direction; and
    lengths of the first channel region and the second channel region in the circumferential direction are same.

4. A display panel, comprising a plurality of thin-film transistors the plurality of thin-film transistors are arranged along a first direction;
    wherein each of the plurality of thin-film transistors comprising a gate, a gate insulating layer, and a semiconductor layer sequentially disposed from an inside to an outside along a radial direction;
    wherein each of the plurality of thin-film transistors further comprises a source and a drain disposed on a side of the semiconductor layer and arranged at intervals, and the source and the drain are connected to the semiconductor layer;
    wherein the source and the drain are arranged at intervals along a circumferential direction of the gate, and the semiconductor layer is disposed between the source and the drain;
    the display panel further comprising a plurality of scan lines extending in a first direction and a plurality of data lines extending in a second direction, wherein the second direction is perpendicular to the first direction, the scan lines and the data lines define a plurality of pixel units, and each of the pixel units comprises one of the plurality of thin-film transistors and a pixel electrode.

5. The display panel according to claim 4, wherein the plurality of thin-film transistors share the gate.

6. The display panel according to claim 4,
    wherein each of the scan lines comprises a columnar portion extending along the first direction, at least a portion of the columnar portion forms the gate of one of the plurality of thin-film transistors, and the gate insulating layer and the semiconductor layer of one of the plurality of thin-film transistors are sequentially arranged on the columnar portion from the inside to the outside along the radial direction of the columnar portion.

7. An electronic device, comprising a thin-film transistor, wherein the thin-film transistor comprises a gate, a gate insulating layer, and a semiconductor layer sequentially disposed from an inside to an outside along a radial direction;
    wherein the thin-film transistor further comprises a source and a drain disposed on a side of the semiconductor layer and arranged at intervals, and the source and the drain are connected to the semiconductor layer;
    the source and the drain are arranged at intervals along a circumferential direction of the gate, and the semiconductor layer is disposed between the source and the drain.

8. The electronic device according to claim 7, wherein the thin-film transistor further comprises a columnar structure, and the gate, the gate insulating layer, and the semiconductor layer are sequentially disposed from the inside to the outside along the radial direction of the columnar structure.

9. The electronic device according to claim 7, wherein along the circumferential direction of the thin-film transistor, a first channel region and a second channel region are provided between the source and the drain, and the semiconductor layer exposed by the first channel region and the second channel region is connected to the source and the drain along the circumferential direction; and
    lengths of the first channel region and the second channel region in the circumferential direction are same.

* * * * *